United States Patent [19]

Nakamura

[11] Patent Number: 5,389,990
[45] Date of Patent: Feb. 14, 1995

[54] METHOD FOR MEASURING DC CURRENT/VOLTAGE CHARACTERISTIC OF SEMICONDUCTOR DEVICE

[75] Inventor: Osamu Nakamura, Yokohama, Japan

[73] Assignee: Kabushiki Kaisha Toshiba, Kawasaki, Japan

[21] Appl. No.: 965,613

[22] Filed: Oct. 22, 1992

Related U.S. Application Data

[63] Continuation of Ser. No. 598,889, Oct. 19, 1990, abandoned.

[30] Foreign Application Priority Data

Oct. 21, 1989 [JP] Japan .................. 1-272783

[51] Int. Cl.⁶ .............................................. G01R 31/28
[52] U.S. Cl. .................. 324/158.1; 324/73.1
[58] Field of Search .............. 324/158 R, 73.1, 158 D, 324/158 T, 524, 535, 73, 102, , 537, 158.1; 364/571.04, 571.05, 483, 550; 371/25.1

[56] References Cited

U.S. PATENT DOCUMENTS

| | | | |
|---|---|---|---|
| 3,984,667 | 10/1976 | Loshbough | 364/466 |
| 4,008,405 | 2/1977 | Neumann et al. | 307/352 |
| 4,462,083 | 7/1984 | Schwefel | 364/571.05 |
| 4,520,313 | 5/1985 | Allred, Jr. et al. | |
| 4,528,503 | 7/1985 | Cole | |
| 4,613,950 | 9/1986 | Knierim | 364/571.05 |
| 4,648,056 | 3/1987 | Wakefield | 364/571.05 |
| 4,736,351 | 4/1988 | Oliver | |
| 4,827,437 | 5/1989 | Blanton | 364/571.05 |
| 4,859,938 | 8/1989 | Kim et al. | 324/158 D |
| 4,878,209 | 10/1989 | Bassett et al. | 364/550 |
| 4,893,072 | 1/1990 | Matsumoto | 371/25.1 |
| 4,896,282 | 1/1990 | Orwell | 364/571.05 |
| 4,902,966 | 2/1990 | Brust et al. | 324/158 D |
| 4,902,967 | 2/1990 | Flesner | 324/158 D |
| 4,929,888 | 5/1990 | Yoshida | 324/158 R |
| 5,083,299 | 1/1992 | Schwanke et al. | 324/73.1 |

*Primary Examiner*—Ernest F. Karlsen
*Attorney, Agent, or Firm*—Finnegan, Henderson, Farabow, Garrett & Dunner

[57] ABSTRACT

A method for measuring the DC current/voltage characteristic of a semiconductor device includes a first step of setting measurement time based on preset measurement time for the initial measurement and based on the result of a fourth step for the second or succeeding measurement, a second step of measuring the electrical characteristic of a to-be-tested object, a third step of comparing the results of the measurements for the to-be-tested object in the preceding and current cycles and determining that the first and second steps should be repeatedly effected when a difference between the compared measurement results is larger than a preset value and that the measurement should be terminated when the difference is smaller than a preset value, and the fourth step of extending the measurement time by a preset period of time to provide newly set measurement time used in said first step when it is determined in the third step that the first and second steps should be repeatedly effected.

35 Claims, 4 Drawing Sheets

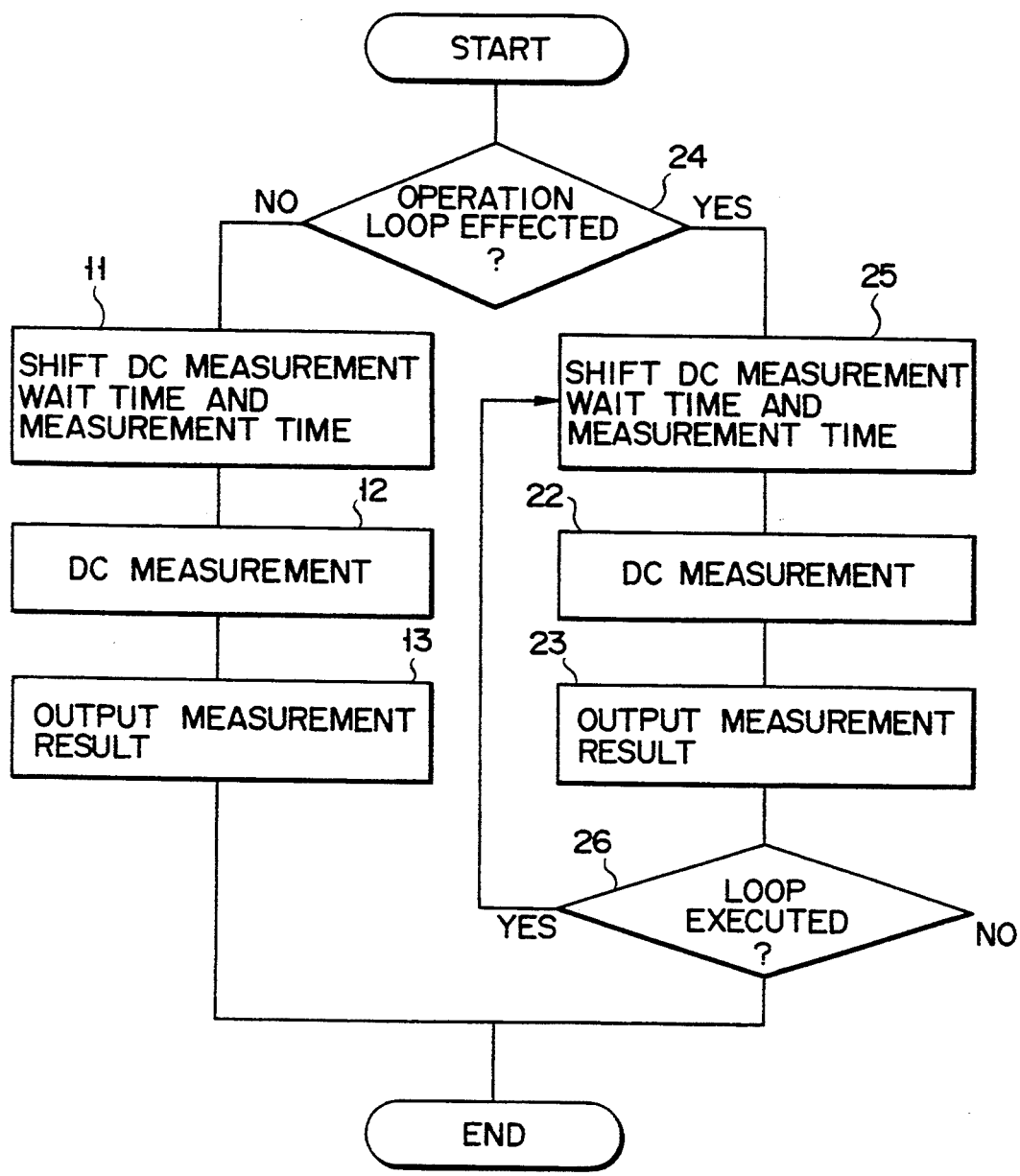
F I G. 1

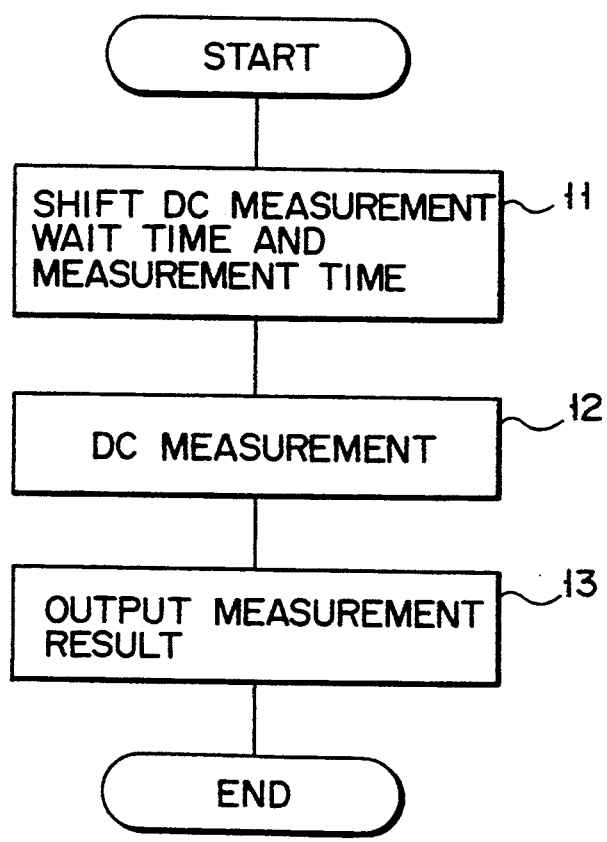
F I G. 2

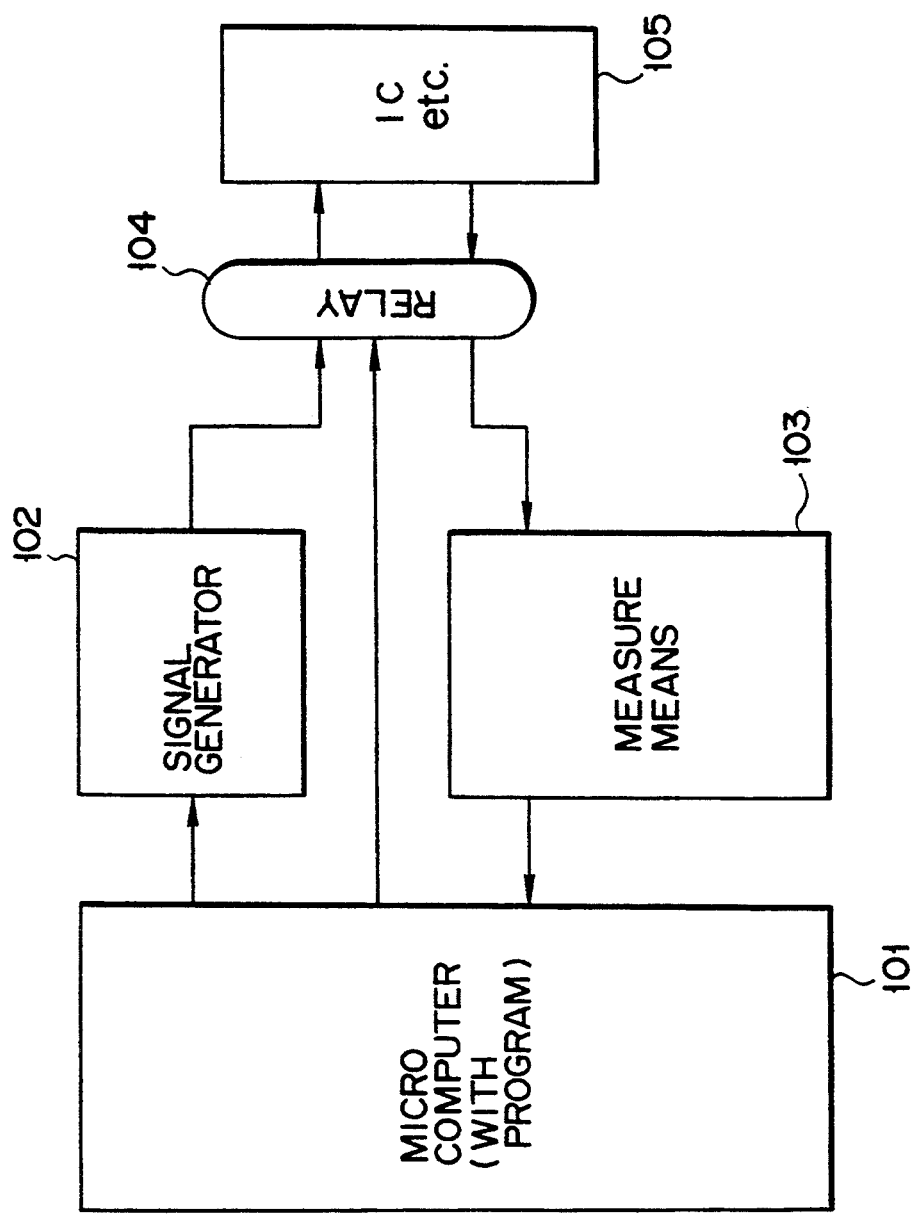
F I G. 4

METHOD FOR MEASURING DC CURRENT/VOLTAGE CHARACTERISTIC OF SEMICONDUCTOR DEVICE

This application is a continuation of application Ser. No. 07/598,889 filed Oct. 19, 1990, now abandoned.

BACKGROUND OF THE INVENTION

1. Field of the Invention

This invention relates to a measuring method of a semiconductor device, and more particularly to a method used in the DC current/voltage characteristic test (which is hereinafter referred to as a DC test) and mainly used as software of a measuring device.

2. Description of the Related Art

FIG. 2 shows the process of a DC test for a semiconductor device to which this invention is not applied.

The process of the DC test for checking whether the semiconductor device is good or defective includes a step 11 of setting the DC measurement waiting time and measurement time, a step 12 of effecting the DC measurement and a step 13 of outputting the result of the DC measurement. The DC measurement waiting time indicates a period from time at which a power source switch for a semiconductor device which is a to-be-tested object is turned on until a voltage is applied to the to-be-tested semiconductor device from the measuring device. The measurement time indicates a period from time at which a voltage is applied to the semiconductor device until an output of the semiconductor device is measured by the measuring device. At this time, the DC measurement waiting time and measurement time in the step 11 are unconditionally determined in the initial stage of the test.

In the test for the semiconductor device to which this invention is not applied, since the DC measurement waiting time and the DC measurement time are fixed before the DC test is effected, it is difficult to determine whether the measurement is correct or not. Therefore, in order to set the optimum DC measurement waiting time and the DC measurement time, it is necessary to repeatedly effect the steps 11, 12 and 13 in FIG. 2, then correct and reset the DC measurement waiting time and the DC measurement time and check the result.

SUMMARY OF THE INVENTION

An object of this invention is to provide a method for measuring the DC current/voltage characteristic of a semiconductor device in which suitable time of measurement for a to-be-tested object can be automatically set.

According to one aspect of this invention, there is provided a method for measuring the DC current/voltage characteristic of a semiconductor device, comprising a first step of setting measurement time based on preset measurement time for the initial measurement and based on the result of a fourth step for the second or succeeding measurement; a second step of measuring the electrical characteristic of the to-be-tested object; a third step of comparing the results of the measurements in the preceding and current cycles and determining that said first and second steps should be repeatedly effected when a difference between the compared measurement results is larger than a preset value and that the measurement should be terminated when the difference is smaller than a preset value; and the fourth step of extending the measurement time by a preset period of time to provide newly set measurement time used in said first step when it is determined in said third step that said first and second steps should be repeatedly effected.

In the method of this invention, the measurement is repeatedly effected for a to-be-tested object while the measurement time which is initially set short is extended by a preset short period of time in each measurement cycle. Then, the results of the measurements in the preceding and current measurement cycles are compared with each other after each measurement cycle so as to check variation in the measurement result. When no variation in the measurement result is detected and the measurement result becomes stable, it is determined that the measurement time is set to a suitable length. The thus set measurement time is dealt as the optimum measurement time and stored. In this way, the measurement time of optimum length is automatically determined.

When a large number of ICs or the like are tested in practice, measurements can be effected most efficiently by use of measurement time automatically determined by the above method.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a flowchart showing an embodiment of this invention;

FIG. 2 is a flowchart showing the DC test in which this invention is not applied;

FIG. 4 is a block diagram schematically showing a measurement system of this invention.

DETAILED DESCRIPTION OF THE PREFERRED EMBODIMENTS

Figure 3:
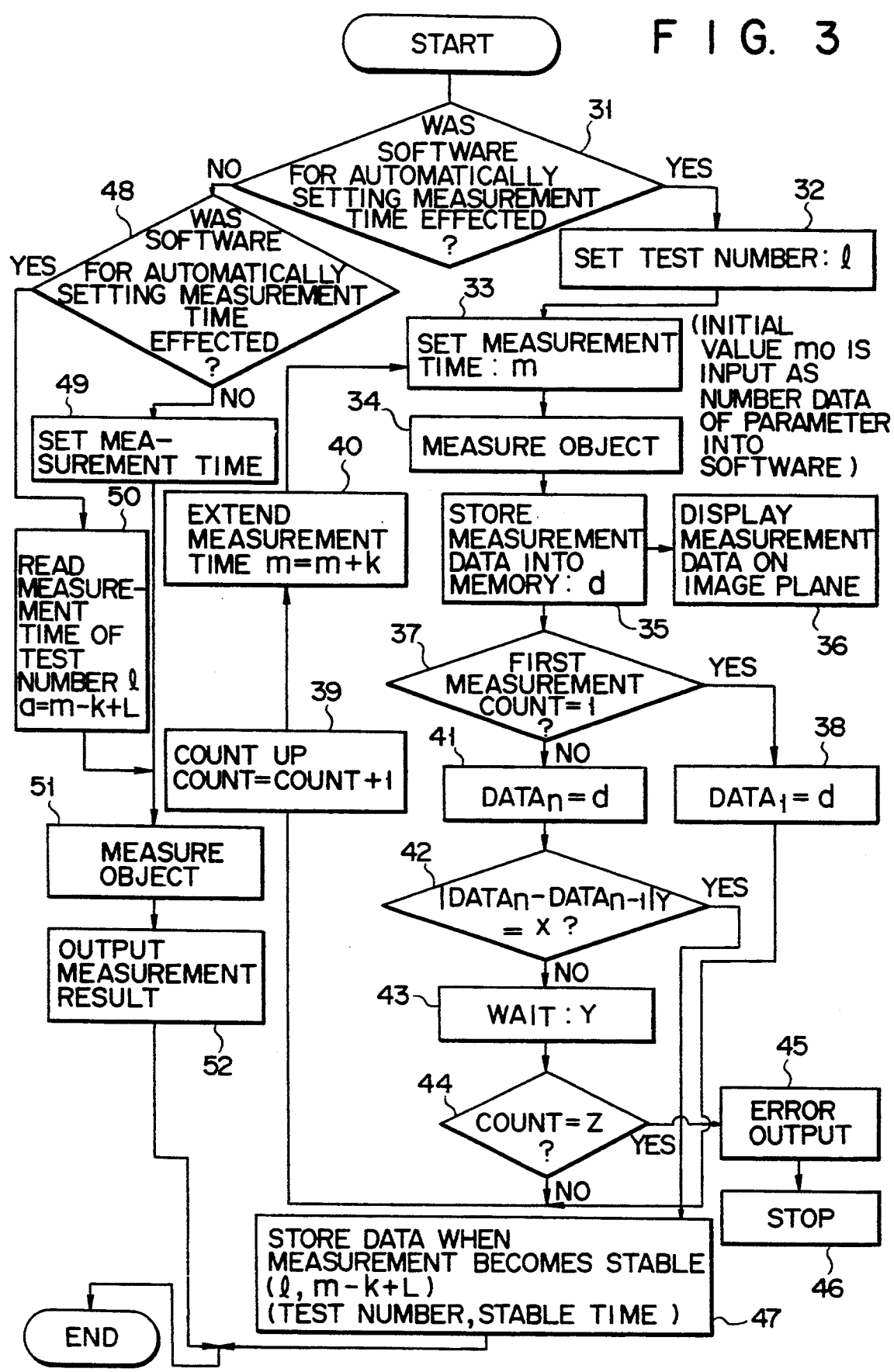
FIG. 3 is a flowchart showing an embodiment of this invention in detail.

There will now be described an embodiment of this invention with reference to the accompanying drawings.

FIG. 1 is a flowchart showing an embodiment of this invention. The measurement method of this invention can be effected by a measurement device for a semiconductor device including a measurement unit for measuring DC current and voltage or the like and a simple microcomputer for processing data of the measurement results.

An object to be tested in this invention includes an operational amplifier, bipolar transistor, MOS IC and the like, and a semiconductor device that requires measurement of the DC current/voltage characteristic or AC current/voltage characteristic may be tested by use of this invention.

In the DC current/voltage characteristic measuring method shown in FIG. 1, 25 indicates a step of setting the measurement waiting time and measurement time based on the measurement result. In this example, the set time is determined based on data obtained in the step of checking the measurement result as will be described below. 22 indicates a step of effecting the DC current and voltage measurement, and 23 indicates a step of outputting the measurement result. Further, 26 indicates a step of determining a condition for repeatedly effecting or interrupting the above three steps. In the step 26, data obtained in the step 23 of outputting the measurement result is checked to be proper or not by comparing the ideal measurement result previously stored and the actual measurement result. Further, it is determined whether or not the measurement time or the like should be changed and the measurement should be repeated, and data indicating the determination result is fed back to the time setting step 25 to execute the processing loop (in the case of "YES"). Otherwise, the measurement result is accepted as proper measurement time or the like and the measurement is terminated (in the case of "NO").

Further, 24 indicates a step of determining whether or not an operation loop according to an embodiment of this invention is effected. In the case of "YES" in the step 24, the step 25 of setting the measurement waiting time and measurement time, the step 22 of effecting the DC current and voltage measurement and the step 23 of outputting the measurement result are repeatedly effected as described before. In the case of "NO", the measurement time is set only once, the measurement is effected and the measurement result is output without effecting the above steps. This operation is selected when proper set time is previously known and a large number of semiconductor devices are subjected to the measurement.

This invention is not limited to the above embodiment. For example, the above process may be effected by means of a suitable analog circuit and a digital circuit instead of effecting the same in the form of computer software, and this invention can be variously modified.

FIG. 3 is a flowchart showing an embodiment of this invention in detail. FIG. 4 is a block diagram schematically showing a measurement system of this invention. This invention of the methods shown by the flowcharts in FIGS. 1 and 3 is effected as one application example in the form of a program of a microcomputer of a measurement system such as a semiconductor device of FIG. 4. In FIG. 4, 101 denotes a microcomputer, 102 a signal generator, 103 a tester, 104 a plurality of relay groups, and 105 an IC or the like which is a to-be-tested object.

The microcomputer 101 has a program of this invention, for controlling the signal generator 102 and relay groups 104. The tester 103 supplies the measurement of the object to the microcomputer 101. The signal generator 102 applies a test voltage and current for measurement of the object. Further, the tester 103 effects the measurement of the object.

The embodiment of FIG. 3 is basically the same as the embodiment of FIG. 1, and includes a measurement time automatic setting mode (right side) for determining the measurement time based on the result of measurement and a normal measurement mode (left side).

The symbols used in this flowchart includes 1 denoting a test number, m denoting measurement time, d indicating the result of measurement, COUNT denoting the number of loops, DATA₁ to DATAn each indicating the result of measurement, X denoting a permissible value of variation, Y denoting wait time, Z indicating the limit of the number of loops, k indicating an increase in the measurement time, and L indicating a margin.

In the embodiment of FIG. 3, 31 is a step of determining whether the software of automatically setting the measurement time is effected or not. In general, when a large number of ICs or the like are checked in the factory, suitable measurement time is determined for respective types of the ICs to be checked and then measurements are continuously and repeatedly effected according to the thus determined measurement time. The step 31 is effected to select such a measurement mode. 32 is a step of setting a test number. 33 is a step of setting the number of a test of measurement time suitable for each type of the ICs or the like. Data is finally stored and used in correspondence with the thus set number. 34 is a step of subjecting the IC or the like to be tested to the measurement process. At this time, a DC/AC voltage or the like is applied to the IC or the like which is a to-be-tested object from a pulse generator, and as the result, DC current and voltage or AC current and voltage from the IC or the like may be measured. Whether an AC or DC voltage is applied to the IC and whether a DC or AC voltage or a DC or AC current is measured may be determined based on the contents of the test. 35 is a step of temporarily storing the measurement data into a memory. 36 is a step of displaying the measurement data on a display plane. 37 is a step of checking whether the measurement of the object effected at this time is the first measurement or not. In this case, the number of measurements is expressed by COUNT and it is checked whether COUNT=1 or not. After the first measurement, the operation of comparing the measurement results in the preceding and current cycles with each other is not yet effected and data is simply stored. 38 is a step of storing data d representing the result of the first measurement into a memory area as DATA₁. 39 is a step of making ready for the next measurement by adding 1 to the measurement count number COUNT. 40 is a step of extending the measurement time m of the next measurement by k. The extended time k can be manually set as a parameter of software and some problem may occur if the extended time is set to be too long or too short. 41 indicates a data process for the second or succeeding measurement and is a step of setting the measurement data d as DATAn. 42 is a step of comparing the measurement data in the preceding and current measurement cycles with each other and checking whether or not a difference between the compared measurement data is larger than a preset permissible value. The permissible value is one of the parameters provided in the software and the operator must input a suitable permissible value in the software based on the contents of the measurement and the to-be-tested object. 43 is a step of setting wait time. 44 is a step of confirming the number of measurements to determine that COUNT=Z before the number of measurements exceeds Z so that the measurements can be prevented from being unnecessarily effected. Z is set by setting the number which is considered to be suitable by the operator as a parameter. 45 is a step of outputting a measurement error. 46 is a step of interrupting the operation of the measurement device at the time of occurrence of the measurement error. 47 is a step of determining that the measurement becomes stable if a difference between the measurements in the preceding and current measurement cycles is smaller than a preset value and storing measurement data into the memory area for respective test numbers. Further, l indicates a test number, m indicates measurement time, k indicates extension time of the measurement time, and L indicates a margin. Data is stored in the form of (l, m−k+L). Thus, the process of automatically setting the measurement time is completed.

Further, 48 is a step of checking whether the software of automatically setting the measurement time has been effected or not. If it is "YES", the measurement can be effected by use of the measurement time. 49 is a step of manually setting the measurement time as a parameter of the software in the case of "NO" in the step of 48. 50 is a step of reading the measurement time for the test number l and using a=m−k+L in the case of "YES" in the step 48. 51 is a step of measuring the DC/AC current or voltage of the object such as an IC. 52 is a step of outputting the measurement result.

According to the process described above, this embodiment which is the same as that of FIG. 1 in principle can be effected to automatically set the optimum measurement time and efficiently check the IC and the like.

Further, the measurement wait time is explained although it is not shown in the flowchart of FIG. 3. The measurement wait time can also be shortened without influencing data and this is the same as in the case of the measurement time.

In order to effect the time shortening process, the measurement wait time is previously set at a constant value, and after the optimum measurement time is set according to the embodiment of FIG. 3, then optimum measurement wait time is automatically determined in the same manner as the process of FIG. 3 for automatically determining the measurement time. That is, short measurement wait time is set without influencing the result of measurement while each measurement result is compared with the result of measurement in the preceding cycle.

Further, according to this invention, other various factors can be automatically set to optimum values without influencing measurement data in the above described manner.

According to the preferred embodiments of this invention, in the DC test for the semiconductor measurement in the testing device for semiconductor devices, the shortest and optimum DC measurement wait time and measurement time can be automatically set without influencing the precision of the measurement by effecting the process set in the device. As a result, in comparison with the measurement time setting process in which this invention is not applied, the measurement time can be further shortened and the measurement precision can be further enhanced.

In the above embodiment, since a selection step for determining whether or not this invention should be effected is provided, the process may be separated from the time setting and measurement result checking loop after the optimum time is set, and then measurements can be continuously and repeatedly effected by use of the thus set time. As a result, when a large number of semiconductor devices are measured, the operation speed can be significantly enhanced.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A measuring method for a semiconductor device comprising the steps of:
   a first step of setting measurement time based on preset measurement time for an initial measurement, and based on the result of a fourth step for a second or succeeding measurement;
   a second step of measuring an electrical characteristic of a to-be-tested object;
   a third step of comparing the results of the measurements for said to-be-tested object in the preceding and current cycles, and determining that said first and second steps should be repeatedly effected when a difference between the compared measurement results is larger than a preset value, and that the measurement should be terminated when the difference is smaller than said preset value; and
   a fourth step of extending the measurement time by a preset period of time to provide a newly set measurement time used in said first step when it is determined in said third step that said first and second steps should be repeatedly effected.

2. A measuring method for a semiconductor device according to claim 1, wherein said second step includes the substep of measuring a DC current/voltage characteristic.

3. A measuring method for a semiconductor device according to claim 1, further comprising:
   a fifth step of determining whether said electrical characteristic measurement is the first measurement after said second step is effected.

4. A measuring method for a semiconductor device according to claim 3, further comprising:
   a sixth step of counting up the number of measurements after said third step is completed.

5. A measuring method for a semiconductor device according to claim 1, further comprising:
   a fifth step of determining whether the number of measurements has exceeded a preset number after said third step is effected.

6. A measuring method for a semiconductor device according to claim 1, further comprising:
   a fifth step of determining whether or not said first, second, third and fourth steps should be effected; and
   a sixth step of manually setting the measurement time in a case where it is determined in said fifth step that said first, second, third and fourth steps should not be effected.

7. A measuring method for a semiconductor device according to claim 6, further comprising:
   a seventh step of determining whether optimum measurement time is determined by effecting said first, second, third and fourth steps before said sixth step is effected; and
   an eighth step of reading the optimum measurement time obtained by effecting said first, second, third and fourth steps and supplying the same time as to be used in said sixth step.

8. A measuring method for a semiconductor device according to claim 1, further comprising:
   a fifth step of setting the number of said object to be measured before said first step is effected.

9. A measuring method for a semiconductor device according to claim 1, further comprising:

a fifth step of displaying the result of measurement on an image screen after said second step is effected.

10. A measuring method for a semiconductor device according to claim 1, further comprising:
a fifth step of setting a preset period of wait time after said third step is effected.

11. A measuring method for a semiconductor device according to claim 5, further comprising:
a sixth step of outputting an error signal after said fifth step is effected.

12. A measuring method for a semiconductor device according to claim 11, further comprising:
a seventh step of completing the measurement of said to-be-tested object after said sixth step is effected.

13. A measuring method for a semiconductor device according to claim 1, further comprising:
a fifth step of storing the measurement result together with the number of said to-be-tested object after the measurement is completed in a case when it is detected as the result of determination in said third step that the difference is smaller than said preset value.

14. A measuring method for a semiconductor device according to claim 13, further comprising:
a fifth step of storing the sum of the measurement result and a marginal value.

15. A measuring method for a semiconductor device comprising:
a first step of setting measurement time based on preset measurement time for an initial measurement and based on the result of a fourth step for a second or succeeding measurement;
a second step of measuring an electrical characteristic of a to-be-tested object;
a third step of comparing the results of the measurements of said object in the preceding and present cycles, and determining that said first and second steps should be repeatedly effected when a difference between the compared measurement results is larger than a preset value and that the measurement should be terminated when the difference is smaller than a preset value;
a fourth step of extending the measurement time by a preset period of time to provide a newly set measurement time used in said first step when it is determined in said third step that said first and second steps should be repeatedly effected;
a fifth step of determining whether said electrical characteristic measurement is the initial measurement after said second step is effected;
a sixth step of counting up the number of measurements after said third step is effected;
a seventh step of determining whether the number of measurements has exceeded a preset number after said third step is effected;
an eighth step of determining whether said first, second, third and fourth steps should be effected or not;
a ninth step of manually setting measurement time when it is determined in said eighth step that said first, second, third and fourth steps should not be effected;
a tenth step of determining whether optimum measurement time is set by effecting said first, second, third and fourth steps before said ninth step is effected; and
an eleventh step of reading the optimum measurement time obtained by effecting said first, second, third and fourth steps and supplying the same time as to be used in said ninth step.

16. A measuring method for a semiconductor device according to claim 1, wherein the first step includes the substep of setting a time from when a power source voltage is supplied to said to-be-tested object until a test voltage for measurement is applied to said object.

17. A measuring method for a semiconductor device according to claim 15, wherein the first step includes the substep of setting a time from when a power source voltage is supplied to said to-be-tested object until a test voltage for measurement is applied to said object.

18. A measuring method for a semiconductor device according to claim 15, wherein said second step includes the substep of measuring a DC current/voltage characteristic.

19. A measuring method for a plurality of semiconductor devices comprising:
a first step of measuring an electrical characteristic of a first semiconductor device, using a time between applying a first to the semiconductor device and measuring an electrical characteristic of the first semiconductor device to produce a measurement result;
a second step of determining whether the first step should be repeated based on the measurement result, and changing the time when it is determined that the first step should be repeated; and
a third step of subsequently measuring an electrical characteristic of the plurality of semiconductor devices, using the time changed in the determining and changing step.

20. A measuring method for a plurality of semiconductor devices according to claim 19, further comprising:
a fourth step, effected after said second step, of outputting said result of measurement.

21. An apparatus for measuring semiconductor devices, comprising:
means for measuring an electrical characteristic of an object to supply measurements;
generator means for supplying a test voltage to said object;
relay means for selectively coupling said generator means to said measuring means; and
means, responsive to said measuring means, for controlling said measuring means, said signal generator means, and said relay means, said controlling means including means for setting measurement time based on preset measurement time for an initial measurement and based on the processing of a means for extending for a succeeding measurement; means for comparing the results of the measurements of said object in the preceding and current cycles to determine that said first and second means should be repeatedly effected when a difference between the compared measurement results is larger than a preset value and that the measurement should be terminated when the difference is smaller than a preset value; and means for extending the measurement time by a preset period of time to provide newly set measurement time used in said first means when it is determined by said third means that said first and second means should be repeatedly effected.

22. A measuring method for a plurality of semiconductor device according to claim 1, further including a step of changing a potential applied to the semiconductor device.

23. A measuring apparatus for a semiconductor device comprising:
    first means for setting a measurement time based on a preset measurement time for an initial measurement, and based on a newly set measurement time for a second or succeeding measurement;
    second means, coupled to the first means, for measuring the electrical characteristic of a to-be-tested object;
    third means, coupled to the first means, for comparing the results of the measurements for said to-be-tested object in the preceding and current cycles, and determining that the measurement of said first and second means should be repeatedly effected when a difference between the compared measurement results in larger than a preset value, and that the measurement should be terminated when the difference is smaller than said preset value; and
    fourth means, coupled to the first means, for extending the measurement time by a preset period of time to provide the newly set measurement time used in said first means when said third means determines that the measurement of said first and second means should be repeatedly effected.

24. A measuring method for a semiconductor device comprising the steps of:
    setting a first measurement time based on a preset value;
    a first step of measuring an electrical characteristic of the semiconductor device, for the first measurement time, to generate a first result;
    setting a second measurement time;
    a second step of measuring the electrical characteristic of the semiconductor device, for the second measurement time, to generate a second result;
    comparing the second result with the first result; and
    fixing a final measurement time based on the above comparison and measuring of multiple semiconductor devices for the final measurement time.

25. A measuring method according to claim 24, wherein the setting step includes the substep of
    setting a time between applying a voltage to the semiconductor device and measuring an output of the semiconductor device.

26. A measuring method according to claim 24, wherein the comparing step includes the substep of
    performing adjusting and second measuring steps when the first result and the second result are substantially different.

27. A measuring method according to claim 26, wherein the setting step includes the substep of
    setting a time between applying a voltage to the semiconductor device and measuring an output of the semiconductor device.

28. A measuring method for a plurality of semiconductor devices comprising:
    measuring a current characteristic of a first semiconductor device, using a time between applying a voltage to the semiconductor device and measuring the current characteristic of the semiconductor device;
    determining whether the previous step should be repeated, and changing the time when it is determined that the previous step should be repeated; and
    subsequently, measuring a current characteristic of the plurality of semiconductor devices, using the time changed in the determining and changing step.

29. A measuring method for a plurality of semiconductor devices according to claim 28, wherein the determining and changing step includes the substep of changing a time between applying the voltage and applying another voltage to the semiconductor device.

30. A measuring method for a plurality of semiconductor devices according to claim 29, wherein the determining and changing step further includes the substep of changing a potential applied to the semiconductor device.

31. A measuring method for a semiconductor device comprising the steps of:
    setting a first measurement time based on a preset value;
    a first step of measuring an electrical characteristic of the semiconductor device, for the first measurement time, to generate a first result;
    setting a second measurement time, including the substep of
        setting a time between applying a voltage to the semiconductor device and measuring an electrical characteristic of the semiconductor device;
    a second step of measuring the electrical characteristic of the semiconductor device, for the second measurement time, to generate a second result;
    comparing the second result with the first result; and
    fixing a final measurement time based on the above comparison and measuring an electrical characteristic of multiple semiconductor devices for the final measurement time.

32. A measuring method for a semiconductor device comprising the steps of:
    setting a first measurement time based on a preset value;
    a first step of measuring an electrical characteristic of the semiconductor device, for the first measurement time, to generate a first result;
    setting a second measurement time, including the substep of
        setting a time between applying a voltage to the semiconductor device and measuring an electrical characteristic of the semiconductor device;
    a second step of measuring the electrical characteristic of the semiconductor device, for the second measurement time, to generate a second result;
    comparing the second result with the first result, including the substep of
        performing setting and second measuring steps when the first result and the second result are substantially different; and
    fixing a final measurement time based on the above comparison and measuring an electrical characteristic of multiple semiconductor devices for the final measurement time.

33. A measuring method for a plurality of semiconductor devices comprising the steps of:
    measuring a voltage characteristic of a first semiconductor device, using a time between applying a voltage to the semiconductor device and measuring the voltage characteristic of the semiconductor device;
    determining whether the previous step should be repeated, and changing the time when it is determined that the previous step should be repeated; and subsequently, measuring a voltage characteristic of the plurality of semiconductor devices, using the time changed in the determining and changing step.

34. A measuring method for a plurality of semiconductor devices according to claim 33, wherein the determining and changing step includes the substep of changing a time between applying the voltage and applying another voltage to the semiconductor device.

35. A measuring method for a plurality of semiconductor devices according to claim 34, wherein the determining and changing step further includes the substep of changing a potential applied to the semiconductor device.

* * * * *

UNITED STATES PATENT AND TRADEMARK OFFICE
CERTIFICATE OF CORRECTION

PATENT NO. : 5,389,990
DATED : February 14, 1995
INVENTOR(S) : Osamu NAKAMURA

It is certified that error appears in the above-indentified patent and that said Letters Patent is hereby corrected as shown below:

Claim 19, col. 8, line 21, "applying a first to" should read --applying a voltage to--.

Claim 22, col. 8, line 68, "device" should read --devices--.

Signed and Sealed this

Fifth Day of March, 1996

BRUCE LEHMAN

Attest:

Attesting Officer

Commissioner of Patents and Trademarks